United States Patent [19]
Lapeyre

[11] Patent Number: 4,891,777
[45] Date of Patent: Jan. 2, 1990

[54] SINGLE HAND KEYBOARD ARRAYS PROVIDING ALPHANUMERIC CAPABILITIES FROM TWELVE KEYS

[75] Inventor: James M. Lapeyre, New Orleans, La.

[73] Assignee: The Laitram Corporation, New Orleans, La.

[21] Appl. No.: 862,647

[22] Filed: May 13, 1986

Related U.S. Application Data

[63] Continuation of Ser. No. 528,975, Sep. 2, 1983, abandoned, which is a continuation-in-part of Ser. No. 493,613, May 11, 1983, abandoned.

[51] Int. Cl.$^4$ .............................................. G06F 3/02
[52] U.S. Cl. ................................ 364/706; 364/709.15; 364/709.16
[58] Field of Search .................... 364/706, 704, 709.15, 364/704.16; 400/482, 485, 489, 100; 340/365 R; 178/17 C; 341/22

[56] References Cited

U.S. PATENT DOCUMENTS

| | | | |
|---|---|---|---|
| 1,590,998 | 6/1926 | Balston | 400/482 |
| 2,318,519 | 5/1943 | Palanque | 400/482 |
| 3,225,883 | 12/1965 | Ayres | 340/365 R |
| 3,892,958 | 7/1975 | Tung | 364/709 |
| 3,967,273 | 6/1976 | Knowlton | 340/365 R |
| 4,041,295 | 8/1977 | Ido et al. | 364/709 |
| 4,042,777 | 8/1977 | Bequaert et al. | 179/79 |
| 4,067,431 | 1/1978 | Whitaker | 340/365 R |
| 4,202,038 | 5/1980 | Peterson | 364/709 |
| 4,272,826 | 6/1981 | Deutsch | 364/709 |
| 4,344,069 | 8/1982 | Prame | 340/365 S |
| 4,360,892 | 11/1982 | Endfield | 178/17 C |
| 4,400,593 | 8/1983 | Kunz | 340/365 R |
| 4,412,210 | 10/1983 | Washizuka et al. | 364/709 |

FOREIGN PATENT DOCUMENTS

| | | |
|---|---|---|
| 2924515 | 6/1979 | Fed. Rep. of Germany . |
| 490000 | 8/1938 | United Kingdom . |
| 511240 | 8/1939 | United Kingdom . |

OTHER PUBLICATIONS

Beausoleil et al., "Compact Keyboard", *IBM Tech. Disclosure Bulletin*, vol. 13, No. 11, Apr. 1971, p. 3574.

*Primary Examiner*—David H. Malzahn
*Attorney, Agent, or Firm*—Laurence R. Brown; Alfred J. Mangels

[57] ABSTRACT

A keyboard system has a keyboard geometric arrangement enriched in intersections of three keys achieved by offsetting or staggering adjacent keys. This provides a greater number of choices from a given number of keys actuable manually one, two or three at a time. The key layout permits touch typing with one hand where twelve keys provides fill alphanumeric capabilities. Finger positions conform with human hand structure and include raised ridges for identifying some of the fingerstroke key selection locations. Thus, accurate high speed typing with either hand is feasible in a telephone dial space frame. The keyboard communicates by an X by Y communication channel matrix or telephone system compatible tone signals with computers, telephones, teletypes and like utility devices. Program steps and function selection is afforded by a self-cataloged two (or more) keystroke sequence to reduce programming time and increase the number of selections possible per key. Thus, as few as four keys and four wires can afford fourteen manual selections by a single fingerstroke in a single live key mode.

25 Claims, 12 Drawing Sheets

SINGLE FINGER DEPRESSES KEYS: XEQ, 1 & 2 t = thumb
i = index
m = middle
r = ring
l = little

Fig. 6

PAPER AND/OR C.R.T.

DEAR MR. JONES:

THIS IS TO ADVISE THAT YOUR ORDER IS READY FOR SHIPMENT. OUR SHIPPING DEPARTMENT IS AWAITING YOUR INSTRUCTIONS AS TO HOW YOU WANT THE SHIPMENT TO BE MADE.

YOUR OPTIONS ARE: REGULAR TRUCK FREIGHT, U.P.S. OR AIR.

SINGLE HAND KEYBOARD ARRAYS PROVIDING ALPHANUMERIC CAPABILITIES FROM TWELVE KEYS

This application is a continuation of Ser. No. 06/528,975 filed Sept. 2, 1983, now abandoned, which is a continuation-in-part of Ser. No. 493,613 filed May 11, 1983, now abandoned, for Contoured Touch Type Data Processing Keyboard.

TECHNICAL FIELD

This invention relates to keyboards and more particularly it relates to touch type keyboards operable by one hand offering a large number of key selection choices such as required for alphanumeric computer applications.

BACKGROUND ART for Contoured Touch Type Data Processing Keyboard.

At this advanced stage of the development of the computer art commercially available chips provide systems capable of many types of functional operations and full alphameric data processing capabilities.

The keyboard computer input art has been developed to interface with computer systems. Thus, for example, U.S. Pat. No. 3,892,958 - C. C. Tung provides a multiple key keyboard with means for changing the mode of computer operation to adapt the keyboard to three different sets of functions, all illustrated on keyboard indicia and with the three modes and corresponding key functions differentiated by indicia of three different colors, such as black, orange and blue.

Also other techniques are known in the prior art for producing more functions per key in a keyboard assembly in an attempt to interface with more of the computer functions by a keyboard of modest size. Exemplary are: U.S. Pat. No. 4,042,777 - F. C. Bequaert et al., Aug. 16, 1977 which permits chords of several simultaneously actuated keys to supplement individual keystrokes and thus expand the communication interface capabilities of a keyboard with a computer. German Publication No. DE 2924515 - S. Pretzsch published Jan. 15, 1981 provides for selection of more than one of several adjacent keys simultaneously by a single fingerstroke to increase the number of selections on a keyboard; and U.S. Pat. No. 4,344,069 - E. S. Prame, Aug. 10, 1982 provides a single handed keyboard with alphanumeric capabilities by selecting a sequence of keystrokes for alpha characters.

However, none of these keyboards are operable to enter comprehensive data and instructions in a computer in the touch mode similar to that of touch typewriters, where data may be entered quickly and accurately by a typist with little effort or explicit choice decisions after becoming acquainted with the keyboard layout. In particular, it is not feasible in the prior art to use a keyboard of so few keys that it can be operated by a single hand to enter a comprehensive set of different data and instructions, for example a hundred and fifty different selectable choices that provides full alphanumeric data operation as well as full computer control and access. Furthermore, there have not been significant developments in the art, other than the above-mentioned U.S. Pat. No. 4,042,777, that relate to the interface of a one hand operated keyboard and a computer in such a way that touch typing can proceed. There have been no known such keyboard systems developed with the particular objects of one-handed computer entry with rapidity and elimination of the source of errors from such manual actions as hitting a wrong key, hitting extra keys, resting the fingers on a wrong set position or counting a sequence of numbered key actuations for an entry. No particular attention has been given to operator finger fatigue or avoidance of unnatural finger positions and reach.

It is therefore an objective of this invention to improve the state of the art by resolving some of these problems and providing improved keyboard systems not heretofore available in the art. Other objects, features and advantages of the invention will be found throughout the following description, the drawings and the claims.

DISCLOSURE OF THE INVENTION

A keyboard for use by one hand and adapted for entry of a large number of selections including those for alphanumeric data processing and a large range of computer operation commands has ten keys providing direct entry of numerical digits plus a decimal key and at least one auxiliary command key. A preferable arrangement uses twelve keys in a layout pattern particularly adapted for one hand selection by the fingers on either hand. The system, by means of "virtual" keys selectable by simultaneous actuation of two or more individual keys, provides typically at least one hundred and fifty selections with full alphanumeric data processing capability, wherein each entry requires a single fingerstroke. The keyboard is particularly adapted to the touch typing mode and provides an interaction of keys, layout, functional selection, system, etc. which avoids those mental requirements of choice on the part of an operator that lead to errors. Also, the system includes features which prevent errors due to physical fatigue or motion, particularly of the sort where unnatural motion, reach or position is required.

Thus, the keyboard has five columns coinciding with the natural position of the five fingers on a hand. The keys in adjacent columns are offset to permit the hand to use the board with the fingers in natural position. That is the middle finger is longer than the ring finger and index finger, and the thumb and little finger are the shortest. With this keyboard therefore the keys are offset to coincide with this natural finger length condition.

To produce the many selection choices of entry such as more than one hundred and fifty, the keyboard operates in at least three modes, for example, each providing direct entry with a single fingerstroke of fifty or more selections. Thus, a single finger selects either a single key or a plurality of keys appearing adjacent each other and sharing common sides on the keyboard layout. The offset keys further provide a wider range of keystroke choices than would otherwise be available.

To facilitate the touch system of key selection, groups of keys are provided with a single finger selection position not interfering with any other finger selection position by means of groups of associated discrete raised ridge portions vertically projected from the keyboard surface at the lines of separation of the adjacent keys. To extend the number of groupings possible several of the outermost keys are shaped to span more than one of the other keys in both the key columns and across a plurality of the columns.

BRIEF DESCRIPTION OF THE DRAWINGS

In the drawings:

FIGS. 6 and 7 are examples of how the keyboard can be incorporated into computing instruments and show the approximate real scale of the keyboard in relation to well known components of the instruments;

THE PREFERRED EMBODIMENT

Figure 1:
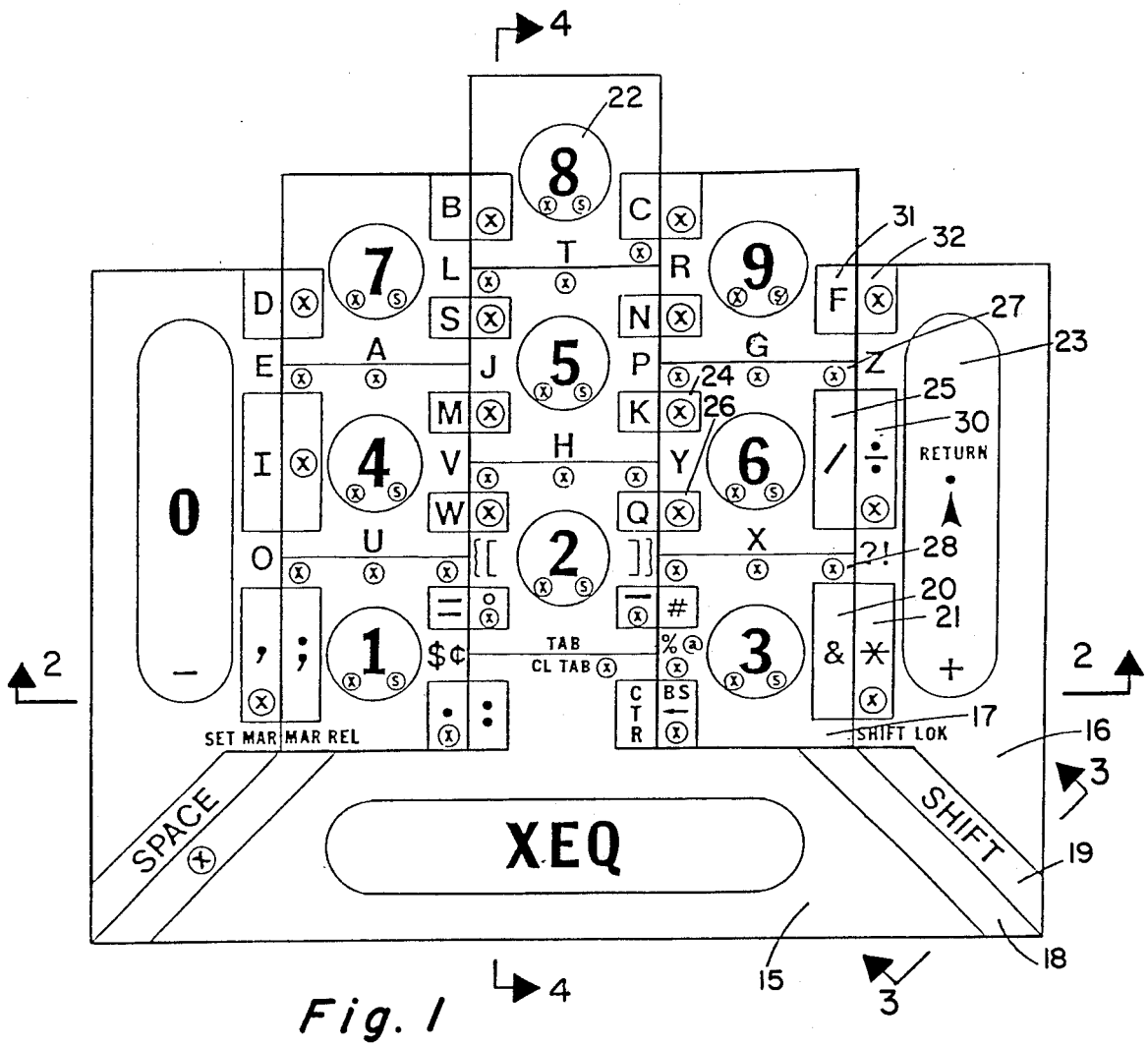
FIG. 1 is a plan view of a twelve key keyboard assembly embodying a preferred embodiment of this invention.

As may be seen in the plan view of FIG. 1, a twelve key keyboard layout is afforded that provides a plurality in the order of fifty or more data or function selections as noted by the indicia. Thus, the twelve basic keys 15, 16, 17, etc. provide for the numeric digit entries as well as a pair of command keys for executing functions selected (15) or entering data into the computer (16). The latter key 16 may also be a decimal point key on a first stroke and a data entry key on the second stroke.

Figure 2:
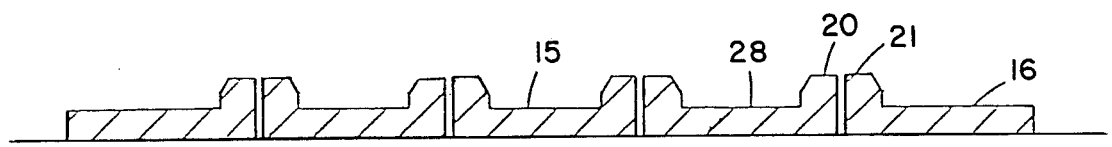
FIG. 2 is a sectional view taken along the lines 2—2 of FIG. 1 showing the elevational differences of the key surfaces configured for selection of a plurality of side-by-side keys for concurrent actuation by the stroke of a single finger.
Figure 3:
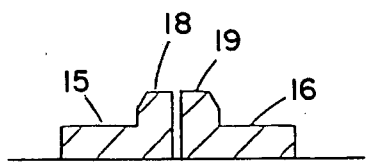
FIG. 3 is a sectional view taken along the lines 3—3 of FIG. 1 showing the raised portions 18 and 19 for concurrent actuation by the stroke of a single finger to provide the shift function.

All the other entries are made from "virtual" keys by the concurrent selection of two or more of the twelve keys. This is made feasible in the touch mode for operation with a single hand, either right or left, using a single finger for stroking each entry in a well defined fingerstroke position easily accessible for the touch system. Thus groups of ridged key portions or bars 18, 19 or 20, 21 etc. are found throughout the keyboard, as are profiled in FIGS. 2, 3 and 4.

Figure 8:
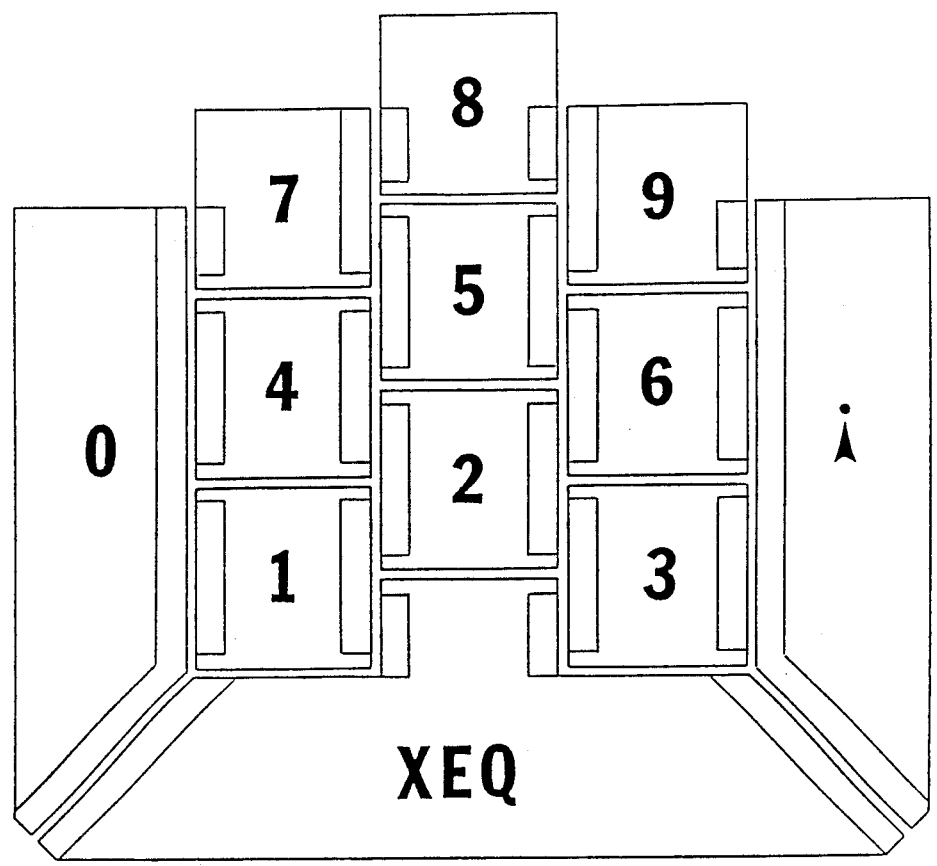
FIGS. 8 and 9 are provided to show that the raised portions can have various shapes as dictated by ergonomic considerations.
Figure 9:
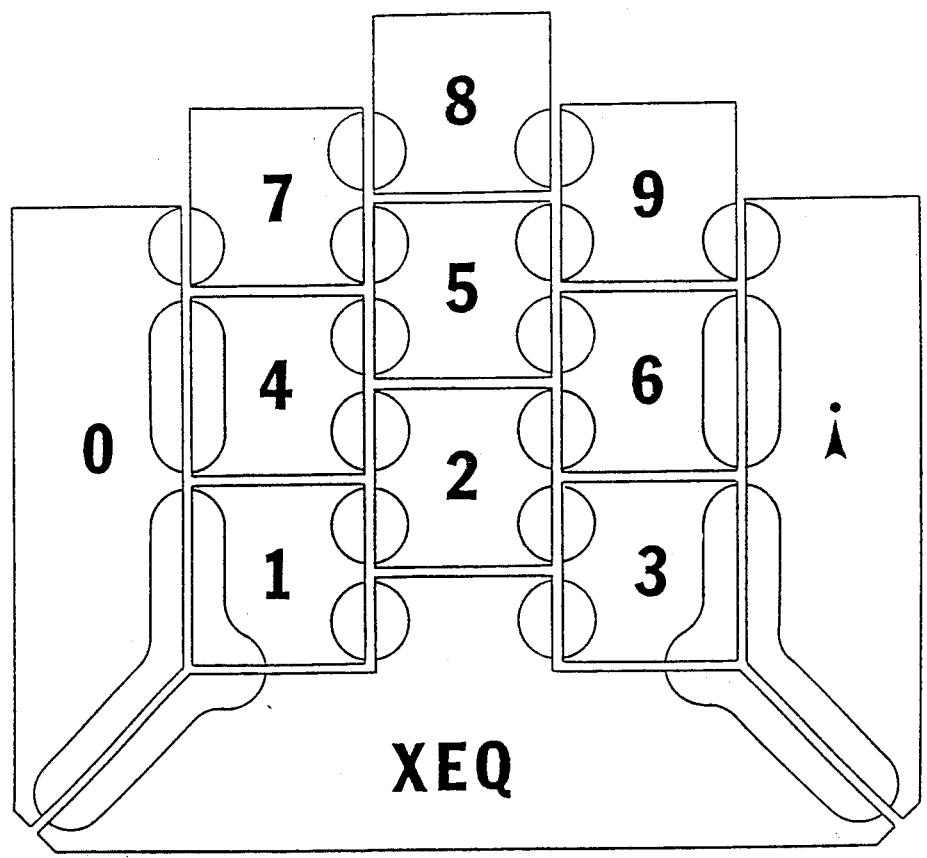

To some extent the shape and size of the raised portions are controlled to permit the labeling of the characters used. Touch tests using dummy models among a limited number of people indicate a divergence in preference as to the shape, height, length and touch area of the raised portions extending from the key-switch surfaces. Therefore I do not limit myself to any particular embodiment. Any changes that aid the user in actuating the keys singly or in multiples with a single fingerstroke is believed to be within the scope of the invention. To illustrate that changes can be made while maintaining workability of the invention the ridge shapes of FIGS. 8 and 9 may be observed. Special shapes may be required for persons with long fingernails.

It is seen that for every indicia position, noting the function of the key stroke made at that location, is a finger selection spot where only one entry can be made. The single keys are actuated at the circles 22 or oblongs 23. The "virtual" keys comprising multiple key groups are actuated at the bar groupings such as the asterisk (*) at 20, 21 or the shift at 18, 19. The fingers thus in the touch mode can engage only one entry position at a time. The digit 6 for example is recessed within the raised portions 24, 25, 26 which all move together and confine the finger to spot 6 to actuate only key 27. Conversely the finger at the asterisk 20, 21 engages the two raised bars only and actuate both keys 16 and 28, etc. The notation X between the 6 and 3 locates a fingerstroke position for operating the two keys 27 and 28 concurrently. The bars are not necessary (but may prove useful) at all such intersections, particularly since the finger touch senses a crack between two upper-by-lower keys.

The notation ? is located between two bar pairs 20, 21 and 25, 30 and identifies a fingerstroke position for actuating three keys 16, 27, 28 simultaneously by means of four bars 20, 21, 25, 30. Note that elongated columnar key 16 spans several (3, 6, 9) columnar keys to give a variety of combinations selectable at three bar pair locations 20, 21 and 25, 30 and 31, 32. Similarly elongated cross spanning key 15 spans the five columns to provide five two key combinations. Note also that by the vertical row offset of the keys in the three center columns of keys a choice of two different keys in an adjacent column can be made in two key pairings such as the "M" and "K" and a set of three keys will result with a four bar selection as at V or Y.

It is seen therefore that enough selections (more than 50) can easily be made with twelve keys to give about the same capacity as a standard typewriter keyboard. This is noteworthy since it can replace a standard telephone switch panel (which normally uses 12 keys) and provide alphanumeric capability, requiring only one hand access.

The tactile identification of different single finger selection spots by bars, keys centers, line junctions, etc. herein considerably enhances the ability to touch type without errors because tactile feedback through the fingers indicates the selection being made. Furthermore errors are caused by fatigue, unnatural and extensive reach and other such factors. Many of these error sources are overcome herein by the keyboard configuration and layout.

Consider the shape of a human hand, for example. The middle finger is long, the ring and index finger of intermediate length and the thumb and little fingers are the shortest. As seen clearly in FIG. 4a, the offset key layout thus fits the human hand to rest it naturally, reducing fatigue or unnatural reach, etc. With only twelve keys the hand rest position is always evident and is more easily identified by tactile feedback.

Operational advantage and accuracy of this keyboard is also evidenced by the single fingerstroke, single finger selection of every entry. Thus, the operator need not think about chording or sequencing and is only required to do the simplest possible thing, select a finger spot and stroke it. Thus, a simple, comprehensive keyboard system is afforded enabling lower error touch type input into electronic data processing or computer systems 40 as set forth in FIG. 5.

In order to better match the keyboard to the multiple functions available in modern computers 40, the mode of operation can be changed, again by a single fingerstroke, to produce a different set of fifty or more functions to the keys. Thus as seen by the small X and S notation in the 8 key (22) three sets of indicia are located on the keyboard. X indicia may be orange and S blue for example to simply show the mode set in color coded form. Thus, on the bar pairs 20 and 21 (FIG. 1) color coded indicia will denote the selection of functions and data available and indicate by color code which mode selection key is required. For example if an "&" is required the shift key bar pair 18 and 19 (S - denoted for some keys as Ⓢ) must be stroked prior to the stroking of bar pair 20 and 21. If the special characters or functions such as * denoted by Ⓧ are required, the stroking of bar pair 20 and 21 must be preceded by the XEQ key. This shifting operation is a conventional one being practiced every day by typists and therefore has proven to be for many years a quite acceptable ergonomic procedure.

Figure 5:
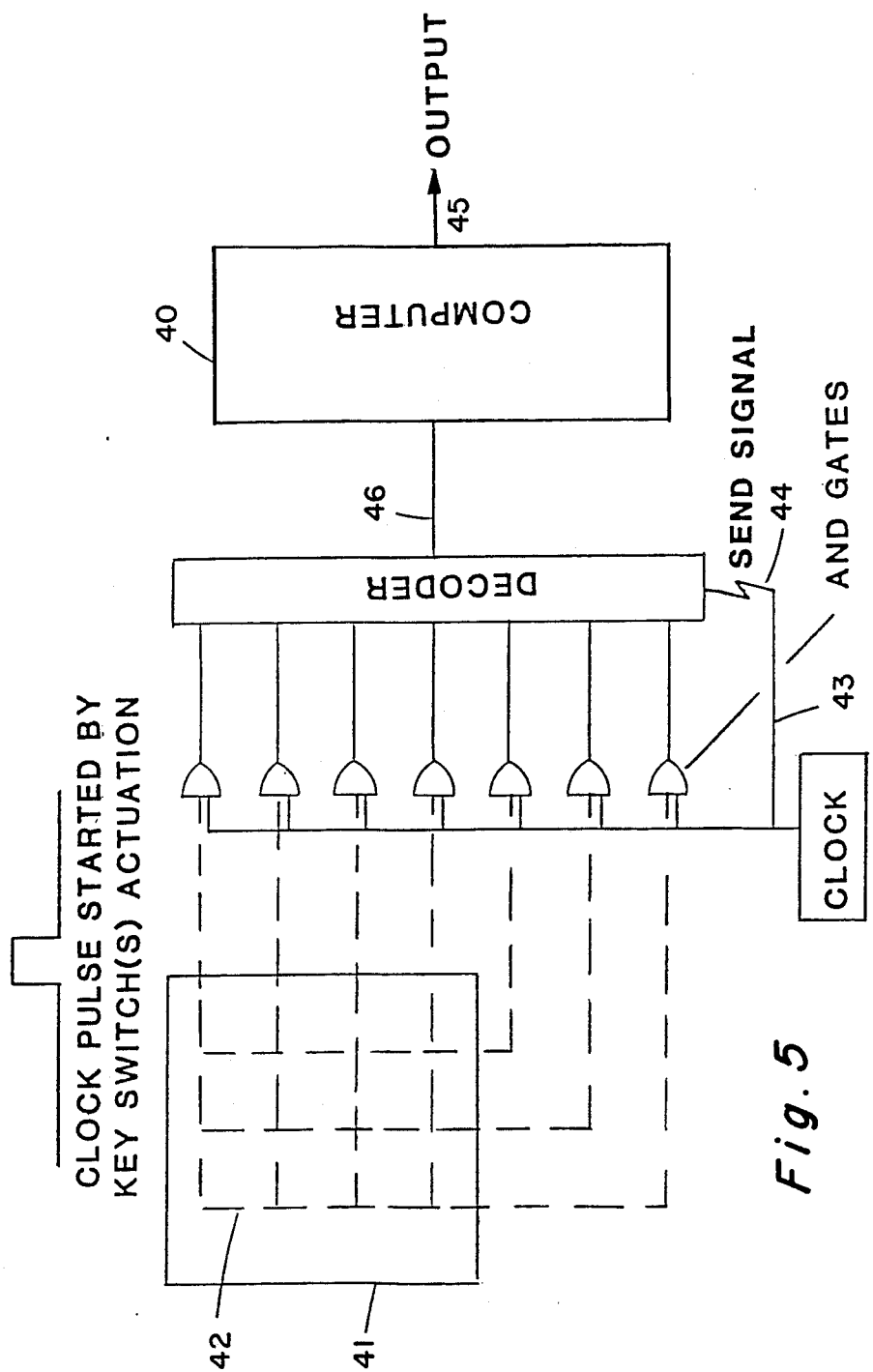
FIG. 5 is a block system diagram of a computer system embodying the invention.

The twelve keys may be wired conventionally as shown in FIG. 5 in a four by three matrix pattern 42 designated on block keyboard 41 to provide 55 output code choices in each mode, ample to convey the unique codes for each of the designated choices available. By conventional clocked code conversion 43, the data entry and functional command processing can be directed upon send signal 44 to computer 40 via 46. The computer output 45 may be directed to suitable devices such as alphanumeric displays, CRT tubes, printers, plotters, etc.

The nine keys for digits 1 to 9 in the three centermost columns, as shown in FIG. 1, are of substantially the same size and shape to adapt to finger selection to operate the separate keys and concurrently operated keys without interference. Also the spacing of the keys is substantially the same as that used as industry "standard" on most typewriters and adding machines which to some extent will reduce the time required for an operator to become proficient in the touch operation of the system. Even those users who do not become proficient with the touch system, such as many executives today, will find the hunt and peck method far easier to use since the keyboard field over which they must hunt is so much smaller than the hunting area presented by the modern computer keyboard which can often have more than 100 keys. Also, the advantages of symmetry are provided for either right or left hand operation, and an improved keyboard system is made available for accurate and rapid touch type operation. Note the spacing of finger touch bars in FIG. 4, wherein the finger can bridge two vertically separated bar groups that can be selected individually when desired. Also note that the finger can feel whether it is in a proper key position at various positions on the keyboard, further contributing to error free selections.

Figure 4:
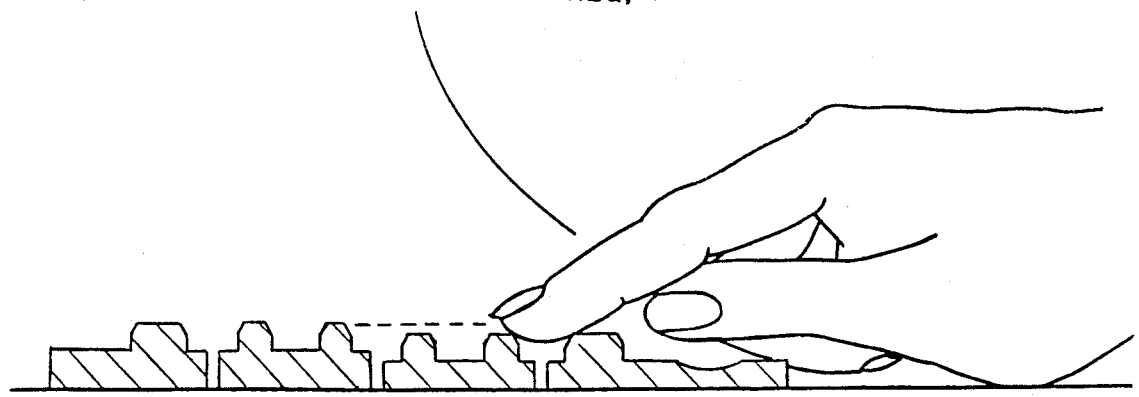
FIG. 4 is a sectional view taken along the lines 4—4 of FIG. 1 showing the elevational differences of the key surfaces configured for selection of a plurality of upper-by-lower keys for concurrent actuation by the stroke of a single finger as illustrated.
Figure 4A:
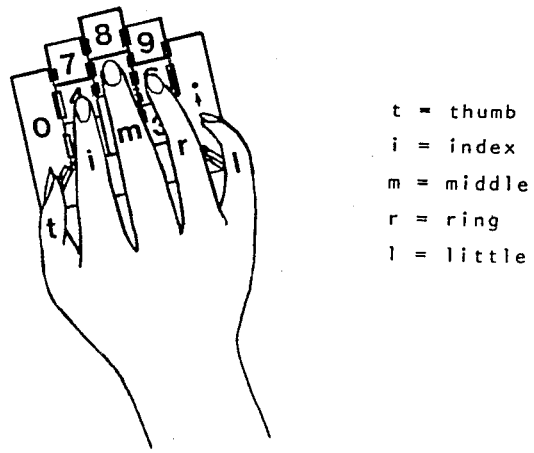
FIG. 4a is a sketch of the right hand identifying the finger nomenclature used throughout this patent application.

Note in consideration of FIGS. 1 and 4 together that raised finger contact structure defining fingerstroke position have portions common to the sides of two adjacent keys, such as . and : or =and °. This permits individual finger selection of the two adjacent keys 1, XEQ or 1, 2, etc. to permit a single finger to bridge a pair of the raised finger contact positions.

Accordingly, either one pair or both pairs of the key ridges straddling the common intersection of three and only three keys can be actuated by a single fingerstroke, thereby increasing the number of available unique fingerstroke selections. That is, either keys 1, 2 or keys 1, XEQ or keys 1, 2, XEQ can be selectively actuated by a single fingerstroke, and similarly this can occur at all the sixteen junctions of 3 and only 3 keys provided in this embodiment.

Because this 12 key keyboard occupies so much less space than a conventional keyboard and because of its symmetry of design, it would be possible to have two such keyboards feeding a single computer whereby the speed of entry into the computer could still further be enhanced since the operator could make use of both hands instead of only one. Also this keyboard is fully compatible with a telephone to provide complete communication capabilities.

FIG. 6 shows an embodiment of the keyboard with the keyboard coupled with a printer as utility means and adapted to work with a data processing system in various modes, such as typing, adding, plotting, teletype communication, arithmetic and programming modes. This is readily attainable at the present state of the art by combining the computer operations of FIG. 5 with display panel 50, printer 51 and switch selection 52, 53 options.

Note also the series of hinged charts 54 tabbed for identification, wherein a sequence of two keystrokes 10, 11, etc. are assigned corresponding functions such as program steps when the switches select the program steps in the program mode. This increases the capacity of the keyboard to use the full capability of modern computer chips with hundreds of possible functions with only twelve keys. Thus, a hybrid mode of operation is employed using the single stroke selections for the errorless typing input feature and expanding capabilities for a simplified programming catalog of a diverse computer language that is self-explanatory and fully self-complete without reference to an instruction manual. Reference is made to copending application Ser. No. 459,998 filed Jan. 21, 1983 for "Computer Keyboards With Few Keys Designating Hundreds of Functions", for a more comprehensive discussion of the advantages of a multiple key stroke mode of operation and the corresponding catalog charts. This application to the extent necessary is included herein by reference.

As seen from the two decimal digit numbers in columns 56 of charts 54, the internally programmed subroutines of a computer such as addition, square root, or various built-in program subroutines identified conventionally by a program language word of variable length is identified by a fixed number X (in this case 2) of numerical or other digits identifying the sequence of key strokes necessary in a two and only two step function selection step. If the mode is program entry (PGM) as selected by switch 53 then a considerable saving of programming time and strokes are saved over conventional variable digit English program words. Clearly the Fortran Statements INTEGER, RETURN, PRINT, CONTINUE, etc. each could be entered by two strokes each at a considerable saving of time and with less chance for error.

This feature unexpectedly therefore can save a considerable amount of programming time over today's conventional program languages such as Fortran and Basic, because for every program step only, two keys need be operated. Yet the corresponding familiar English language or computer language steps may be written into the spaces 55 if desired for the convenience of those familiar with a particular language. Because of the plurality of hinged cards 54, several different modes of operation may be provided and cataloged. Thus, both Fortran and Basic terminology could be related to the two-key sequence selection on different card sets 54. If three keys are selected in sequence, more unique entries are selectable (1000 with numeric numbers alone). If all the (55) keys including virtual are used with two strokes almost three thousand unique selections are available.

Thus by employment of a routine operational step such as limiting the significant decimal digits to two, the functional entries are made by a sequence limited to two (or more) key strokes identified in columns 56 for achieving the displayed functions to be written into blank spaces 55 for immediate access as a catalog of the available functions. It is estimated that a program may be entered in the program mode in this manner with less than one-third the number of key strokes, with a corresponding time saving.

Figure 7:
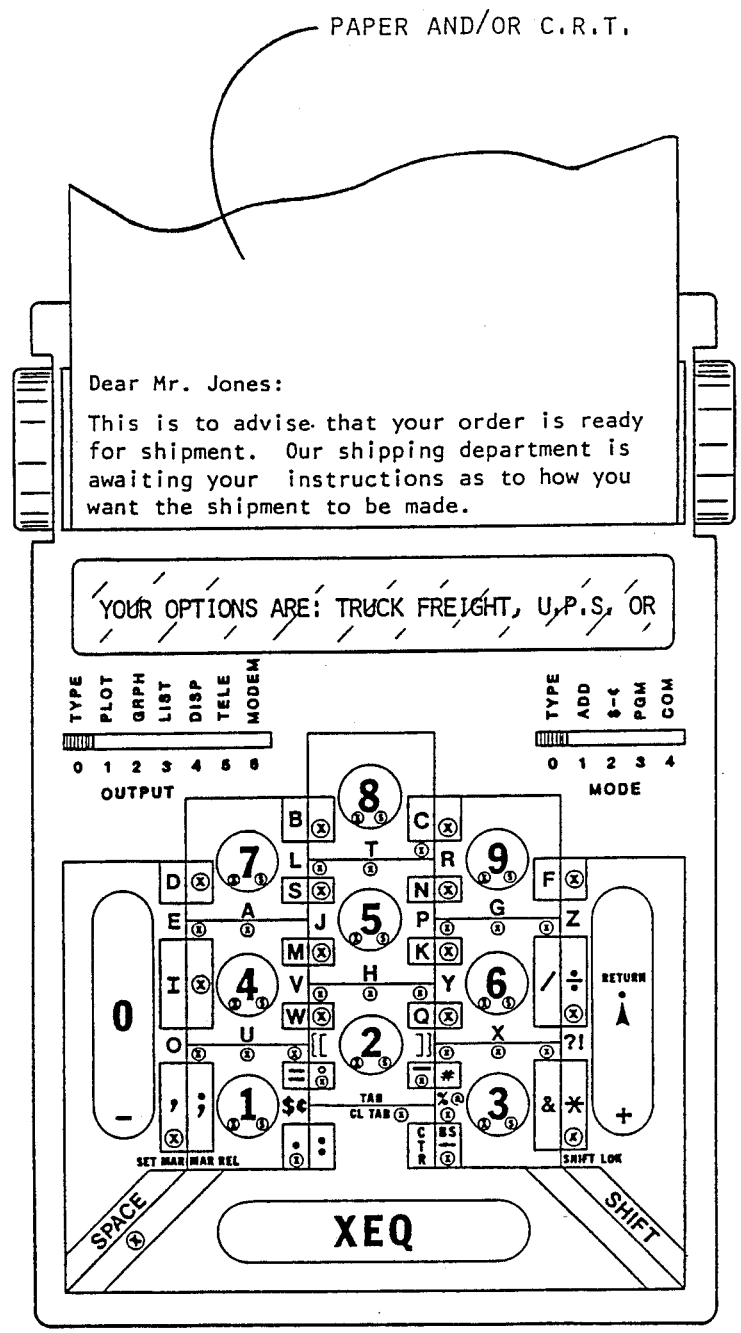

In FIG. 7, the multi-purpose printer-keyboard system is smaller in size and provides a very efficient pocket size typewriter-computer-communication medium with all the foregoing advantages of the novel keyboard system.

Figure 10:
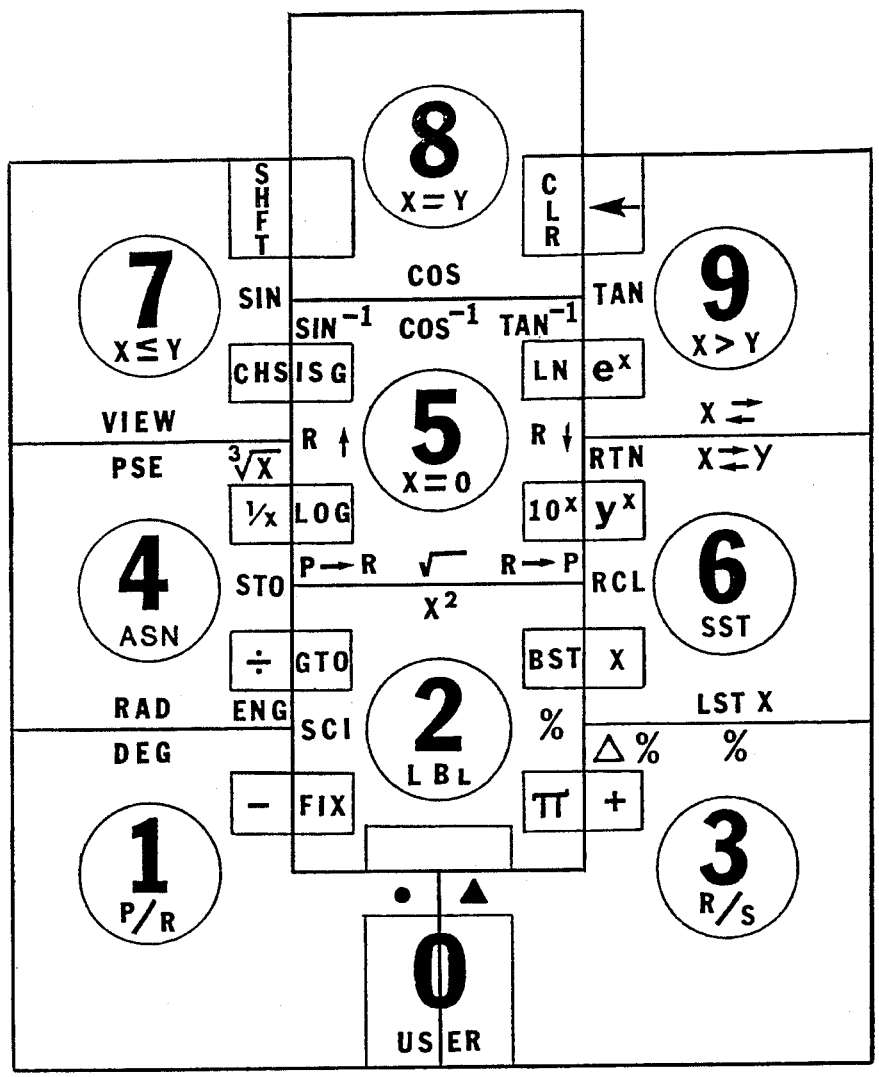
FIG. 10 is provided to show a 9 key embodiment of the invention providing 35 single finger stroke positions.

FIG. 10 is a simpler keyboard layout with only nine keys, thus affording the advantage of operation with a 3×3 wire matrix selection network. Note that there are 35 separate fingerstroke positions so that full alphanumeric capability similar to typewriter keyboards is afforded with all the other keyboard advantages hereinbefore discussed. Note that a field of substantially square keys as in FIG. 1 is arranged in in three adjacent columns with the center column keys offset from the keys in the outer two columns to provide a plurality of nine three and only three key intersection positions.

Figure 11:
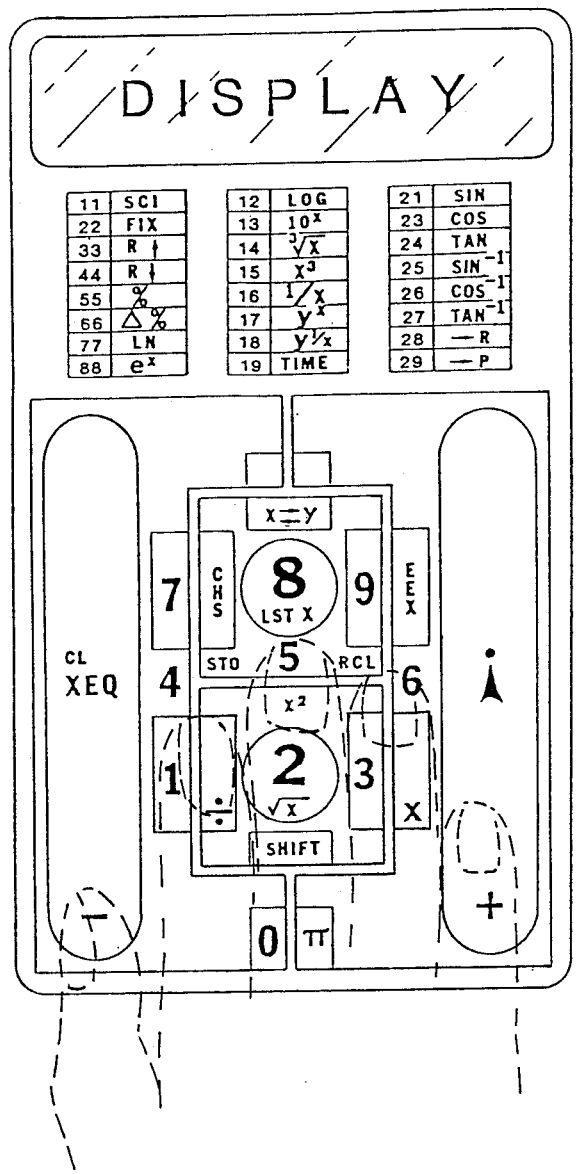
FIG. 11 is a 4-key embodiment of the invention providing 14 single fingerstroke positions and is the minimum desirable configuration of the invention.

A minimal number of keys for attaining numeric instructions to calculators, computers and the like is four as shown in the embodiment of FIG. 11. The finger rest feature and offset key-columnar arrangement here offers the advantages of the prior versions as seen by the phantom hand superimposed over the keyboard to permit touch operation by a single hand in comfortable position. With the four keys and ten virtual keys, fourteen selections are provided in a single mode with a live keyboard. In the three modes hereinbefore described (one preceded by X, one preceded by S and one direct) 52 selections are feasible. This embodiment also has the program chart feature so that for example XEQ 21 will program or select the sine function, etc. With 14 direct selections at the corresponding stations A, B, C, etc., (FIG. 12) as many as 183 separate functions can be programmed with a two-key sequence. Thus, the hybrid system of using a single fingerstroke per entry on typing and data input and using a two (multiple) fingerstroke per selection function in a programming mode significantly extends the power of the keyboard. It is certainly even more unexpected than that only four keys could produce 14 selections that a simple two-step stroke will permit the four keys to select 183+52=235 unique entries in the three mode live T $\bigotimes$ + $\bigcirc{S}$ keyboard operation.

Figure 12:
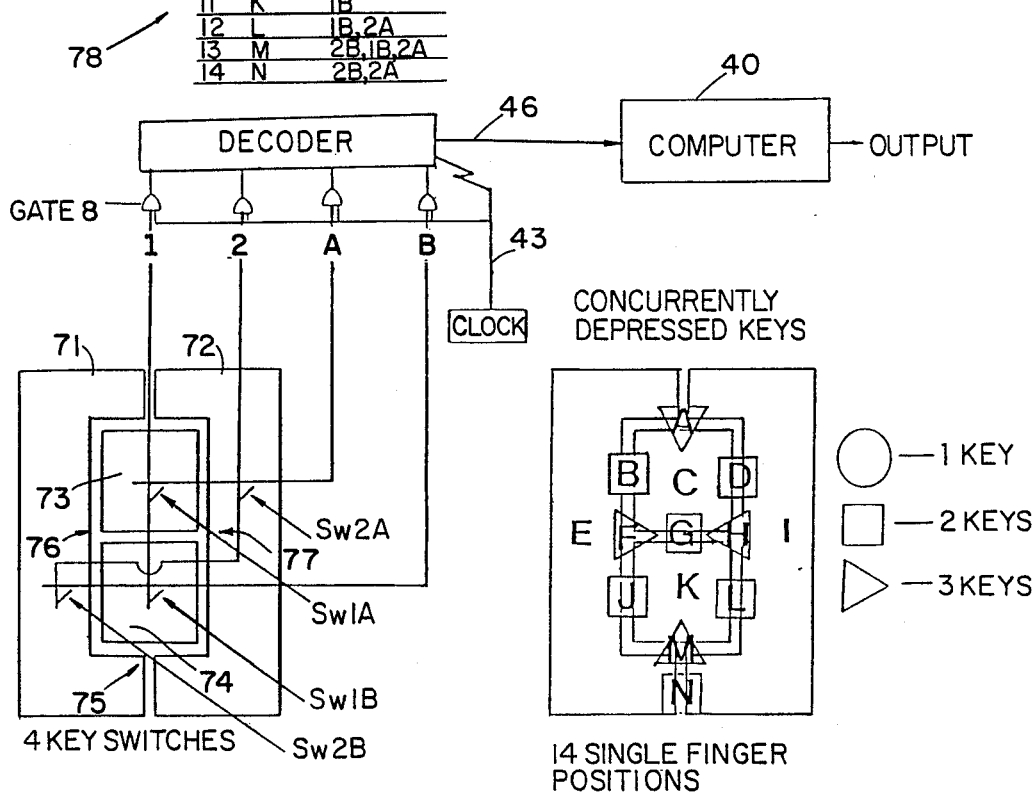
FIG. 12 is a schematic system diagram of a four-key, fourteen selection keyboard configuration operable with a 2×2 four wire switching matrix.

As may be seen by reference to FIG. 12, this surprising expanded keyboard power is in part achieved by the teaching of this invention that the keyboard pattern hereinbefore discussed in common with this embodiment has groups of at least four keys 71, 72, 73, 74 sharing adjacent sides arranged in a geometrical pattern with at least two common intersections 75, 76, 77 of sets of three adjacent keys having all three keys meeting at a common intersection or junction of only three keys in a position accessible to a single finger overlapping the intersection to actuate all three keys simultaneously with a single fingerstroke (A, M, F, H). This provides along with the accompanying single keys (I, E, C, K) and dual side-by-side (B, D, G, J, L, N) with corresponding finger access positions the fourteen direct selections available for a single fingerstroke. In the conventional four corner intersection of non-offset keys, far fewer selections could be made with a given number of keys. Also in a two by two matrix, only three combinations of three keys are available uniquely even if a finger could seek out only three keys together. Thus, only 9 combinations are possible in that mode. For example, Pretzschs, German No. 924515, gets nine selections from four keys conventionally arranged.

Furthermore, it is surprising that a four wire matrix and communication channel (1, 2, A, B) will carry uniquely the full range capacity (253 as above shown) of unique entries available from the four keys. The chart 78 lays out the truth chart codes for the four lines 1, 2, A and B. Note that the matrix to key pattern is also non-conventional and contributes unexpectedly to a reduction in the number of channels required for communication in that the combinations of threes are used (A, F, H. M). This powerful expansion of key power afforded by this invention is correspondingly amplified with the greater number of keys in the preferred embodiment of FIG. 1. The four key embodiment is preferred for such applications as numerical or industrial control systems, coded electronic locks and the like, particularly if wiring is required and fewer wires are advantageous.

Thus, keys 73 and 74 are connected to matrix line 1, keys 71 and 72 to matrix line 2, keys 72 and 73 to matrix line A and keys 71 and 74 to matrix line B to give the fourteen unique combinations shown on truth table 78. Thus four communication channels A, B, 1, 2 can handle all the combinations and entries of this minimal four key version of the invention. Thus a 2×2 matrix of wires connects the keyboard keys as a communication channel to means responsive to key actuation such as computer 40. Each key intercouples two of the matrix wires by actuation of the key, by such means as mechanical switches or equivalents thereof to produce by a single fingerstroke in a single live key operation mode fourteen unique manual selections.

The computer 40 and decoder input thereto 46 here in FIG. 12 as in FIG. 5 is operable in a further mode, as set forth in the hereinbefore referenced copending application, to distinguish and limit in number in an operating mode established by a keyboard entry the successive number of two or more (X) strokes of available key combinations in order to efficiently chart and select a large variety of computer system entries with a uniform number of keystrokes such as two in the manner hereinbefore set forth.

Figure 13:
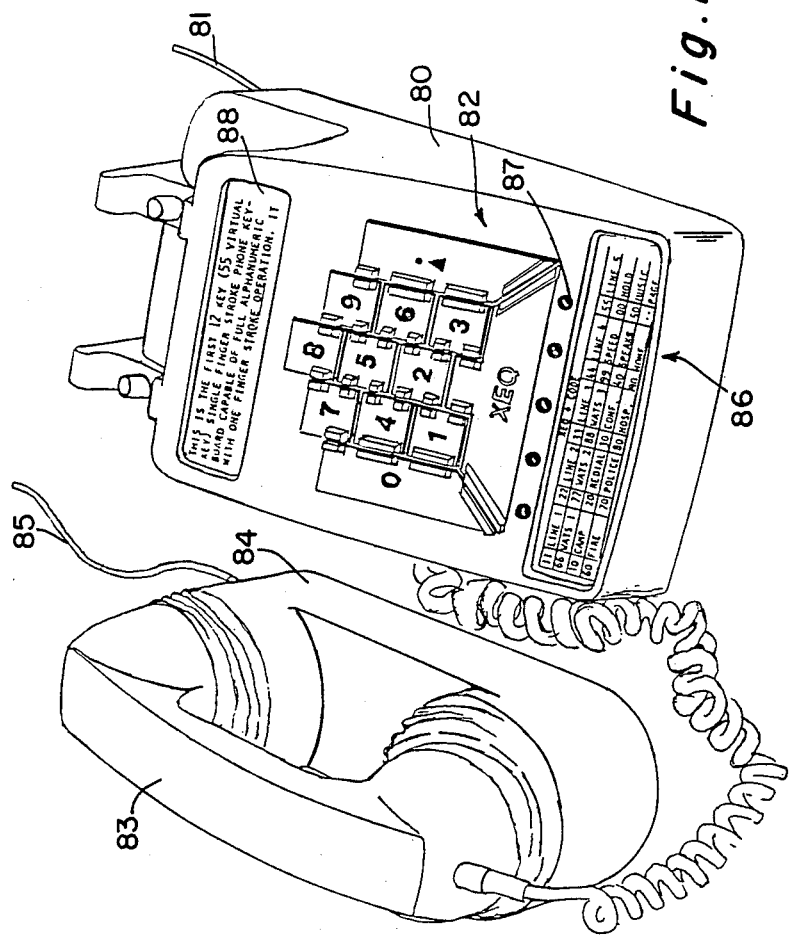
FIG. 13 is a perspective view of a telephone incorporating the advances of this invention for telephone system applications.

The versatility and applicability of the keyboard system afforded by this invention is exemplified by the embodiment seen in FIG. 13. Thus, a desk cradle type telephone 80 of conventional shape has a telephone line connection 81 and the keyboard 82 afforded by this invention. If desired other devices may be acoustically coupled into handset 83 through modem unit 84 from a communicator coupled to cable 85. Also as provided by this invention, the panel 86 outlines a two step switching selection sequence in a program mode which may be established by the execute key (XEQ) with a typical array of functions. Line lights 87 may be provided, and any operating data and messages may show on electronic display 88. Thus a most simple "PBX" type switchboard with full communications and intercomputer connection capabilities is provided and is adaptable for use over the telephone system using conventional tone and/or digital communication techniques. The local switchboard selections are of the coded type hereinbefore discussed in more detail.

Note that the same keyboard can in this way unexpectedly eliminate the extra keys in conventional telephone switching systems provided for the switchboard selections. That is the keyboard does both the dialing function and the switching function and furthermore expands communications from numeric to alphanumeric plus.

Figure 14:
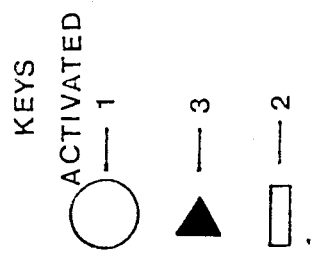
FIG. 14. is a plan view layout of a sixteen key keyboard embodiment.
Figure 14:
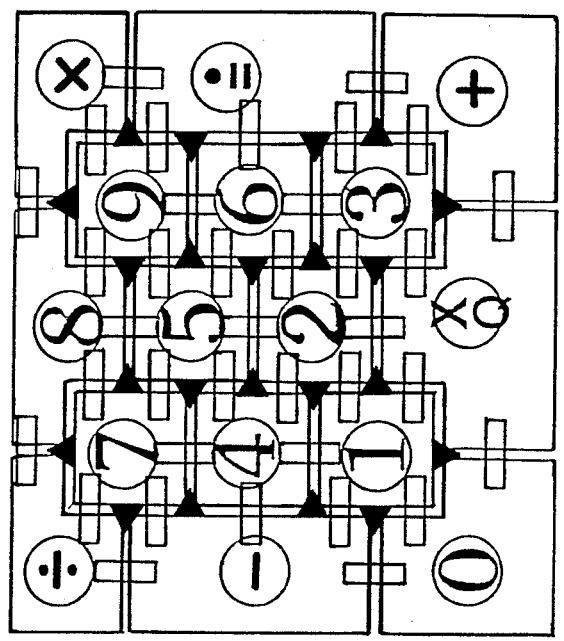

In FIG. 14 a field of sixteen keys is shown maximizing the three key junctions to provide twenty-two such combinations. A sixteen key field is convenient for use of a 4×4 wire matrix. In the illustrated embodiment the keys are shaped to produce seventy-five switching combinations of the single fingerstroke choices of one, two or three concurrently operated keys respectively outlined by the designated coded indicia.

For calculating all possible selections from 16 keys (X) taken 3 (N) at a time in different combinations, the formula $X \cdot (X-1)^{N-1} + 1$ may be used, taking into account that one key (XQ) is used as a common key similar to a shift key. As seen from the table which follows therefore in this embodiment 3601 extra selections of computer functions, addresses, catalog items, etc. could be indexed by the basic sixteen keys operable in a successive key selection mode (of three) such as illustrated in the switching charts of FIGS. 6, 11 and 13.

While certain preferred embodiments are explicitly shown herein other combinations of keys and key layout geometry are possible. Thus, the following table charts the number of functions (F) selectable from keyboard arrays of the numbers of keys (X) between four and fifty-five for sequences (N) of two, three and four successive strokes.

| $F = X \cdot (X-1)^{n-1} + 1$ | | | |
|---|---|---|---|
| X = 4 | X = 17 | X = 30 | X = 43 |
| n = 2    F = 13 | n = 2    F = 273 | n = 2    F = 871 | n = 2    F = 1,807 |
| n = 3    F = 37 | n = 3    F = 4,353 | n = 3    F = 25,231 | n = 3    F = 75,853 |
| n = 4    F = 109 | n = 4    F = 69,633 | n = 4    F = 731,671 | n = 4    F = 3,185,785 |
| X = 5 | X = 18 | X = 31 | X = 44 |
| n = 2    F = 21 | n = 2    F = 307 | n = 2    F = 931 | n = 2    F = 1,893 |
| n = 3    F = 81 | n = 3    F = 5,203 | n = 3    F = 27,901 | n = 3    F = 81,357 |
| n = 4    F = 321 | n = 4    F = 88,435 | n = 4    F = 837,001 | n = 4    F = 3,498,309 |
| X = 6 | X = 19 | X = 32 | X = 45 |
| n = 2    F = 31 | n = 2    F = 343 | n = 2    F = 993 | n = 2    F = 1,981 |
| n = 3    F = 151 | n = 3    F = 6,157 | n = 3    F = 30,753 | n = 3    F = 87,121 |
| n = 4    F = 751 | n = 4    F = 110,809 | n = 4    F = 953,313 | n = 4    F = 3,833,281 |
| X = 7 | X = 20 | X = 33 | X = 46 |
| n = 2    F = 43 | n = 2    F = 381 | n = 2    F = 1,057 | n = 2    F = 2,071 |
| n = 3    F = 253 | n = 3    F = 7,221 | n = 3    F = 33,793 | n = 3    F = 93,151 |
| n = 4    F = 1,513 | n = 4    F = 137,181 | n = 4    F = 1,081,345 | n = 4    F = 4,191,751 |
| X = 8 | X = 21 | X = 34 | X = 47 |
| n = 2    F = 57 | n = 2    F = 421 | n = 2    F = 1,123 | n = 2    F = 2,163 |
| n = 3    F = 393 | n = 3    F = 8,401 | n = 3    F = 37,027 | n = 3    F = 99,453 |
| n = 4    F = 2,745 | n = 4    F = 168,001 | n = 4    F = 1,221,859 | n = 4    F = 4,574,793 |
| X = 9 | X = 22 | X = 35 | X = 48 |
| n = 2    F = 73 | n = 2    F = 463 | n = 2    F = 1,191 | n = 2    F = 2,257 |
| n = 3    F = 577 | n = 3    F = 9,703 | n = 3    F = 40,461 | n = 3    F = 106,033 |
| n = 4    F = 4,609 | n = 4    F = 203,743 | n = 4    F = 1,375,641 | n = 4    F = 4,983,505 |
| X = 10 | X = 23 | X = 36 | X = 49 |
| n = 2    F = 91 | n = 2    F = 507 | n = 2    F = 1,261 | n = 2    F = 2,353 |
| n = 3    F = 811 | n = 3    F = 11,133 | n = 3    F = 44,101 | n = 3    F = 112,897 |
| n = 4    F = 7,291 | n = 4    F = 244,905 | n = 4    F = 1,543,501 | n = 4    F = 5,419,009 |
| X = 11 | X = 24 | X = 37 | X = 50 |
| n = 2    F = 111 | n = 2    F = 553 | n = 2    F = 1,333 | n = 2    F = 2,451 |
| n = 3    F = 1,101 | n = 3    F = 12,697 | n = 3    F = 47,953 | n = 3    F = 120,051 |
| n = 4    F = 11,001 | n = 4    F = 292,009 | n = 4    F = 1,726,273 | n = 4    F = 5,882,451 |
| X = 12 | X = 25 | X = 38 | X = 51 |
| n = 2    F = 133 | n = 2    F = 601 | n = 2    F = 1,407 | n = 2    F = 2,551 |
| n = 3    F = 1,453 | n = 3    F = 14,401 | n = 3    F = 52,023 | n = 3    F = 127,501 |
| n = 4    F = 15,973 | n = 4    F = 345,601 | n = 4    F = 1,924,815 | n = 4    F = 6,375,001 |
| X = 13 | X = 26 | X = 39 | X = 52 |
| n = 2    F = 157 | n = 2    F = 651 | n = 2    F = 1,483 | n = 2    F = 2,653 |

-continued $$F = X \cdot (X - 1)^{n-1} + 1$$

| | | | | | | | |
|---|---|---|---|---|---|---|---|
| n = 3  F = 1,873 | n = 3  F = 16,251 | n = 3  F = 56,317 | n = 3  F = 135,253 |
| n = 4  F = 22,465 | n = 4  F = 406,251 | n = 4  F = 2,140,009 | n = 4  F = 6,897,853 |
| X = 14 | X = 27 | X = 40 | X = 53 |
| n = 2  F = 183 | n = 2  F = 703 | n = 2  F = 1,561 | n = 2  F = 2,757 |
| n = 3  F = 2,367 | n = 3  F = 18,253 | n = 3  F = 60,841 | n = 3  F = 143,313 |
| n = 4  F = 30,759 | n = 4  F = 474,553 | n = 4  F = 2,372,761 | n = 4  F = 7,452,225 |
| X = 15 | X = 28 | X = 41 | X = 54 |
| n = 2  F = 211 | n = 2  F = 757 | n = 2  F = 1,641 | n = 2  F = 2,863 |
| n = 3  F = 2,941 | n = 3  F = 20,413. | n = 3  F = 65,601 | n = 3  F = 151,687 |
| n = 4  F = 41,161 | n = 4  F = 551,125 | n = 4  F = 2,624,001 | n = 4  F = 8,039,359 |
| X = 16 | X = 29 | X = 42 | X = 55 |
| n = 2  F = 241 | n = 2  F = 813 | n = 2  F = 1,723 | n = 2  F = 2,971 |
| n = 3  F = 3,601 | n = 3  F = 22,737 | n = 3  F = 70,603 | n = 3  F = 160,381 |
| n = 4  F = 54,001 | n = 4  F = 636,609 | n = 4  F = 2,894,683 | n = 4  F = 8,660,521 |

It is therefore clear that this invention provides a novel keyboard input interface operable as a manual input device to a data processing system with various advantages including (1) more entries per key, (2) fewer communication channels per entry, (3) natural fit for a typist's hand, (4) single-finger single-stroke single-hand entry selection affording fast error free entry of alphanumeric information with typically twelve keys, (5) tactical feel for right finger positions at each entry, (6) full compatibility with computer, typewriting, telephone and communication link operations, (6) visible catalog of data and functions entered by the keys, (7) faster program entry with fewer strokes, (8) optimum size for pocket instruments and telephones, etc. The state of the art has been unexpectedly improved by a simplification that produces greater versatility and key power saving time and equipment. Therefore, those features of novelty believed descriptive of the spirit and nature of the invention are defined with particularity in the claims.

I claim:

1. A keyboard system comprising in combination, a plurality of manually actuable keys utilizable for manual entry of designated unique data selections such as numerical digits by strokes of a single finger of single keys, utility means comprising an electronic computer for initiating a multiplicity of different data processing operations uniquely selectable as entries by manual actuation with said single finger of said keys, communication means linking the keys to the utility means to effect said data processing operations from unique sets of keys actuated in sequence, means for establishing different ones of said operations in response to a sequence of a fixed number (X) of sequential manual actuations of said keys by said single finger, X being at least two, whereby X and only X sequential key strokes serves to select the different ones of said operations, and means for establishing a program entry mode of computer operation providing selected ones of said data processing operations as program steps in response to manual actuation of said keys thereby to actuate individual ones of said program steps in said program entry mode, thereby providing for entry of a program from the keyboard by a set of defined selection codes each consisting of a sequence of X sequential finger strokes.

2. A keyboard system as defined by claim 1 wherein the keys are on a keyboard panel accompanied by a chart layout identifying each program step by the corresponding selection codes.

3. A keyboard system as defined by claim 2 wherein at least ten manually actuable key selections are operable to enter numerical decimal digits, and said selection codes are decimal numbers of X digits.

4. The keyboard system of claim 1 further comprising means in said computer for establishing a computer response in said program mode to fingerstroke selections of specific n digit constant length code words to initiate built-in computer instruction steps used in formulating a computer program, and means for employing a small number n to establish a short length of code word available to encompass a predetermined schedule of instruction steps to be used, whereby the instruction steps may be entered with fewer keystrokes than with variable length descriptive words of conventional programming languages thereby saving programming time and reducing chances for error.

5. The keyboard system of claim 4 wherein the keys provide for selection of numerical digits 0 to 9, and the n digit words consist of numbers, thereby providing a numbered set of program entry instructions.

6. The keyboard system of claim 4 including means for establishing a data entry mode of the computer producing data entries in response to a single keystroke encompassing one or more keys on the keyboard.

7. The keyboard system of claim 4 including means providing adjacent the keyboard a chart catalog displaying said program entries in said schedule by corresponding ones of said constant length code words and a further associated chart identifying each instructional step with an individual legend.

8. A keyboard system having keys operable by the fingers of a single hand on a keyboard having a plurality of keys thereby to manually enter data into a data processing system, comprising in combination, said keyboard consisting of a single group of keys on the keyboard arranged within reach of said fingers with the hand in a homing position on the keys, circuit means including a data processing system responsive to produce a plurality of individual data system signal entries from the keyboard keys selectively to form entry words only from a sequence of individually selected strokes of the keys by predetermined single ones of the fingers, a geometric arrangement of said keys side-by-side providing a plurality of finger positions significantly exceeding the number of keys for selecting the entries from finger strokes of both the individual keys and a further set of virtual keys comprising side-by-side ones of two and three keys in a position for concurrent stroking by a single finger, said data processing means being coupled to the keyboard keys to receive and process signal entries entered from the keyboard keys and virtual keys by the sequence of finger strokes.

9. The keyboard system of claim 8 wherein the data system comprises means providing stored program subroutines selectable from said keys.

10. The keyboard system of claim 9 including computer means providing a programming mode of operation and stored program subroutines, and means for initiating the program subroutines in response to a fixed sequence of two sequential ones of said finger strokes.

11. The keyboard system of claim 8 having twelve keys with approximately fifty selections of individual and virtual keys, each identified as a finger selection by indicia on the keyboard.

12. The keyboard system of claim 8 wherein two adjacent keys have common sides with ridges extending upwardly to form a common finger actuation structure for finger selections requiring concurrent operation of two keys thereby to present a precisely determined position with tactile feedback at which two concurrent keys may be selected by a single fingerstroke.

13. The keyboard system of claim 8 having twelve keys arranged in a geometric array providing at least thirty nine virtual keys for producing at least fifty selections provided with means for specifying three modes of operation selectable by the keyboard including two shift key selections for changing the keyboard selections from an initial set to two respective further set of selections, thereby providing over one hundred and fifty selections.

14. The keyboard system of claim 8 wherein the keyboard has thereon visible indicia marking the finger position for each selection and identification of the keyboard functional operation afforded in that finger position.

15. The keyboard system of claim 8 having a wide key commonly spanning a plurality of columns of other keys thereby to provide a plurality of selections of two side-by-side keys concurrently stroked by a single finger, namely the wide key and an adjacent key in the respective columns spanned by the wide key.

16. The keyboard system of claim 8 having two keys meeting side-by-side at a line disposed at an angle to the columns for concurrent selection by a single fingerstroke along that line.

17. The keyboard system of claim 8 having groups of more than one key forming a single fingerstroke selection position by means of corresponding groups of key extension ridges each extending from a different key with the ridge positioned adjacent each other at positions where the corresponding keys are in side-by-side relationship thereby to be bridged by a single fingerstroke.

18. The keyboard system of claim 8 mounted on a telephone instrument wherein said data processing system is a telephone system.

19. The keyboard system of claim 8 mounted on a printer and coupled to means for operating the printer in an alphanumeric printout mode.

20. The keyboard system defined in claim 8 coupled to computer means operable to initiate different sets of data processing functions in response to keystrokes in a plurality of at least two modes, wherein the keys and virtual keys produce different functions in response to fingerstroke actuations in the different modes.

21. The keyboard system defined in claim 8 coupled to a system operable in a selectable mixed hybrid mode from said keyboard, one mode comprising the concurrent actuation of one or more keys by a single fingerstroke to produce a corresponding set of signals, and the other mode requiring the successive actuation of keys by at least two single fingerstrokes for a single entry of a signal to produce a second set of signals.

22. The keyboard system as defined in claim 8 coupled to operate a "PBX" type telephone system operable in two modes, namely in a primary keyboard mode for telephone dialling and as switchboard connection switching means operable by actuation of the keys.

23. A keyboard system as defined in claim 8 consisting of a set of four keys sharing adjacent sides arranged in a geometrical pattern with at least two common intersections of sets of three adjacent keys having sides of all three keys meeting at a common intersection of only three keys in a position accessible to a single finger overlapping the intersection to actuate all three keys simultaneously with a single fingerstroke.

24. The keyboard system defined in claim 8 consisting of four keys with four key intersections providing four single key selections and ten virtual key selections defined by different unique combinations of one, two and three keys with the keyboard layout dimensioned for unique access at each of the fourteen selections for a key stroke with a human finger.

25. The data processing keyboard system of claim 8 wherein the system is a telephone system and means coupling the keys for dialling.

* * * * *